US012585841B2

(12) United States Patent
Alexeev et al.

(10) Patent No.: US 12,585,841 B2
(45) Date of Patent: Mar. 24, 2026

(54) QUANTUM SIMULATION

(71) Applicant: UCHICAGO ARGONNE, LLC,
Chicago, IL (US)

(72) Inventors: Yuri Alexeev, Naperville, IL (US);
Alexey Galda, Chicago, IL (US);
Danylo Lykov, Chicago, IL (US)

(73) Assignee: UCHICAGO ARGONNE, LLC,
Chicago, IL (US)

( * ) Notice: Subject to any disclaimer, the term of this
patent is extended or adjusted under 35
U.S.C. 154(b) by 1051 days.

(21) Appl. No.: 17/400,013

(22) Filed: Aug. 11, 2021

(65) Prior Publication Data

US 2023/0047145 A1 Feb. 16, 2023

(51) Int. Cl.
G06F 30/20 (2020.01)
G06N 10/00 (2022.01)

(52) U.S. Cl.
CPC ............. G06F 30/20 (2020.01); G06N 10/00
(2019.01)

(58) Field of Classification Search
CPC ................................ G06F 30/20; G06N 10/00
USPC ........................................................ 703/21
See application file for complete search history.

(56) References Cited

U.S. PATENT DOCUMENTS

| | | | | |
|---|---|---|---|---|
| 11,010,666 | B1 * | 5/2021 | Terilla | G06N 20/00 |
| 11,144,689 | B1 * | 10/2021 | Cowtan | G06N 10/20 |
| 11,250,190 | B2 * | 2/2022 | Pednault | G06F 17/16 |
| 11,442,891 | B2 * | 9/2022 | Feig | G06N 10/40 |
| 11,488,049 | B2 * | 11/2022 | Cao | G06N 10/60 |
| 11,526,793 | B2 * | 12/2022 | Daraeizadeh | G06T 15/005 |
| 11,526,795 | B1 * | 12/2022 | McMahon | G06N 20/00 |
| 11,636,370 | B2 * | 4/2023 | Romero | G06N 3/0475 |
| | | | | 706/62 |
| 11,681,775 | B2 * | 6/2023 | Babbush | G06N 10/60 |
| | | | | 705/2 |
| 11,681,939 | B2 * | 6/2023 | Kerenidis | G06N 10/40 |
| | | | | 706/62 |
| 11,694,108 | B2 * | 7/2023 | Tezak | G06N 20/10 |
| | | | | 703/14 |
| 12,019,959 | B2 * | 6/2024 | Huang | G06F 30/20 |
| 12,051,005 | B2 * | 7/2024 | Ronagh | G06N 3/092 |
| 12,067,458 | B2 * | 8/2024 | Gonthier | G06F 15/16 |
| 2017/0214410 | A1 * | 7/2017 | Hincks | G06N 10/20 |
| 2019/0042974 | A1 * | 2/2019 | Daraeizadeh | G06N 7/01 |
| 2019/0095561 | A1 * | 3/2019 | Pednault | G06F 17/16 |

(Continued)

OTHER PUBLICATIONS

Markov et al. (Simulating quantum computation by contracting
tensor networks, 2009, arXiv , pp. 1-21) (Year: 2009).*

(Continued)

*Primary Examiner* — Iftekhar A Khan

(74) *Attorney, Agent, or Firm* — FOLEY & LARDNER
LLP

(57) ABSTRACT

A method for reducing computation time while simulating
quantum computation on a classical computer by performing
an algorithm used to determine the most efficient input
contraction, the method including receiving, by a processor,
a tensor network representing a quantum circuit, computing,
by the processor, an ordering for the tensor network by an
ordering algorithm, contracting, by the processor, the tensor
network by eliminating indices according to the ordering
resulting in a contracted tensor network, and returning, by
the processor, the contracted tensor network.

15 Claims, 7 Drawing Sheets

(56) References Cited

U.S. PATENT DOCUMENTS

| | | | | |
|---|---|---|---|---|
| 2019/0332731 A1* | 10/2019 | Chen | | G06N 10/20 |
| 2020/0226487 A1* | 7/2020 | Radin | | G06N 10/20 |
| 2020/0327440 A1* | 10/2020 | Cao | | G06N 20/00 |
| 2020/0327441 A1* | 10/2020 | Cao | | G06N 10/60 |
| 2020/0334107 A1* | 10/2020 | Katabarwa | | G06N 10/20 |
| 2021/0209270 A1* | 7/2021 | Huang | | G06N 10/20 |
| 2021/0272006 A1* | 9/2021 | King | | G06N 10/60 |
| 2021/0334313 A1* | 10/2021 | Huang | | G06F 16/9024 |
| 2021/0334690 A1* | 10/2021 | Huang | | G06F 18/2323 |
| 2021/0374611 A1* | 12/2021 | Ronagh | | G06N 3/0499 |
| 2021/0397772 A1* | 12/2021 | Liu | | G06F 30/3308 |
| 2021/0398621 A1* | 12/2021 | Stojevic | | G06N 3/0464 |
| 2022/0044141 A1* | 2/2022 | Ibe | | G06F 15/16 |
| 2022/0108218 A1* | 4/2022 | Wall | | G06N 5/01 |
| 2022/0147667 A1* | 5/2022 | Motta | | G06F 30/27 |
| 2022/0245499 A1* | 8/2022 | Schutski | | G06N 10/60 |
| 2022/0269961 A1* | 8/2022 | Pramanik | | G06N 20/00 |
| 2022/0391571 A1* | 12/2022 | Dhand | | G06N 10/20 |
| 2022/0405626 A1* | 12/2022 | Naveh | | G06N 10/00 |
| 2023/0047145 A1* | 2/2023 | Alexeev | | G06N 10/80 |
| 2023/0267358 A1* | 8/2023 | Zhang | | G06N 10/80 706/62 |
| 2023/0289640 A1* | 9/2023 | Zhang | | G06N 10/20 |

OTHER PUBLICATIONS

Schutski et al. (Simple heuristics for efficient parallel tensor contraction and quantum circuit simulation, 2020, arXiv, pp. 1-11) (Year: 2020).*

Chen et al. (Classical Simulation of Intermediate-Size Quantum Circuits, 2018, arXiv, pp. 1-12) (Year: 2018).*

Zhao et al. (Simulation of Quantum Computing on Classical Supercomputers, arXiv, 2020, pp. 1-6) (Year: 2020).*

Arute, et al., "Quantum supremacy using a programmable superconducting processor," Nature 574, pp. 505-510 (2019).

Bernstein & Vazirani, "Quantum Complexity Theory," SIAM Journal on Computing 26(5), pp. 1411-1473 (1997).

Bodlaender, "A Tourist Guide through Treewidth," Utrecht University Department of Computer Science, Technical Report RUU-CS-92-12, 24 pages (1993).

Bodlaender, et al., "On Exact Algorithms for Treewidth," European Symposium on Algorithms: Algorithms—ESA 2006, pp. 672-683 (2006).

Boxio, et al., "Simulation of low-depth quantum circuits as complex undirected graphical models," retrieved from https://arxiv.org/abs/1712.05384, 12 pages (2018).

Chen, et al., "Classical Simulation of Intermediate-Size Quantum Circuits," retrieved from https://arxiv.org/abs/1805.01450, 12 pages (2018).

Chi-Chung, et al., "On Optimizing a Class of Multi-Dimensional Loops with Reduction for Parallel Execution," Parallel Processing Letters 7(2), pp. 157-168 (1997).

Cichocki, et al., "Tensor Networks for Dimensionality Reduction and Large-scale Optimization: Part 1 Low-Rank Tensor Decompositions," Foundations and Trends in Machine Learning 9(4-5), pp. 249-429 (2016).

De Raedt, et al., "Massively parallel quantum computer simulator," Computer Physics Communications 176(2), pp. 121-136 (2007).

Dechter, "Bucket Elimination: A Unifying Framework for Several Probabilistic Inference," retrieved from https://arxiv.org/abs/1302.3572, pp. 211-219 (2013).

Farhi & Harrow, "Quantum Supremacy through the Quantum Approximate Optimization Algorithm," retrieved from https://arxiv.org/abs/1602.07674, 23 pages (2019).

Farhi, et al., "A Quantum Approximate Optimization Algorithm," retrieved from https://arxiv.org/abs/1411.4028, 16 pages (2014).

Fried, et al., "qTorch: The quantum tensor contraction handler," PLoS ONE 13(12), e0208510, 20 pages (2018).

Gogate & Dechter, "A complete anytime algorithm for treewidth," UAI '04: Proceedings of the 20th conference on Uncertainty in artificial intelligence, pp. 201-208 (2004).

Grayh & Kourtis, "Hyper-optimized tensor network contraction," retrieved from https://arxiv.org/abs/2002.01935, 22 pages (2021).

Haner, et al., "0.5 petabyte simulation of a 45-qubit quantum circuit," SC '17: Proceedings of the International Conference for High Performance Computing, Networking, Storage and Analysis, 10 pages (2017).

Kloks, et al., "Computing treewidth and minimum fill-in: All you need are the minimal separators," European Symposium on Algorithms: Algorithms—ESA '93, pp. 260-271 (1993).

Li, et al., "Quantum Supremacy Circuit Simulation on Sunway TaihuLight," retrieved from https://arxiv.org/abs/1804.04797, 11 pages (2018).

Markov & Shi, "Simulating Quantum Computation by Contracting Tensor Networks," SIAM Journal on Computing 38(3), pp. 963-981 (2008).

Pednault, et al., "Pareto-Efficient Quantum Circuit Simulation Using Tensor Contraction Deferral," retrieved from https://arxiv.org/abs/1710.05867, 44 pages (2020).

Schutski, et al., "Adaptive algorithm for quantum circuit simulation," Physical Review A 101, 042355, 9 pages (2020).

Schutski, et al., "Simple heuristics for efficient parallel tensor contraction and quantum circuit simulation," retrieved from https://arxiv.org/abs/2004.10892, 11 pages (2020).

Smelyanskiy, et al., "qHIPSTER: The Quantum High Performance Software Testing Environment," retrieved from https://arxiv.org/abs/1601.07195, 9 pages (2016).

Tamaki, "Positive-instance driven dynamic programming for treewidth," Journal of Combinatorial Optimization 37, pp. 1283-1311 (2019).

Villalonga, et al., "A flexible high-performance simulator for verifying and benchmarking quantum circuits implemented on real hardware," npj Quantum Information 5, 86, 16 pages (2019).

Villalonga, et al., "Establishing the quantum supremacy frontier with a 281 Pflop/s simulation," Quantum Science and Technology 5(3), 034003, (2020) (14 page accepted manuscript provided).

Wang, et al., "Quantum approximate optimization algorithm for MaxCut: A fermionic view," Physical Review A 96, 022304, 13 pages (2018) (https://arxiv.org/abs/1706.02998 version provided).

Wu, et al., "Full-state quantum circuit simulation by using data compression," SC '19: Proceedings of the International Conference for High Performance Computing, Networking, Storage and Analysis, 24 pages (2019).

Zhao, et al., "Simulation of Quantum Computing on Classical Supercomputers," retrieved from https://arxiv.org/abs/2010.14962, 6 pages (2020).

* cited by examiner

QUANTUM SIMULATION

GOVERNMENT SUPPORT CLAUSE

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present application relates generally to a method of simulating quantum computation on a classical computer.

BACKGROUND

With large data-sets and computationally-intensive technologies becoming more prevalent, there is a need to decrease computation time and increase computation power to best handle these technologies. Current widely-available computing systems, also known as classical computers, function using binary code, where data can only be stored as either a "0" or a "1". This proves to be a limitation in how quickly data can be processed by classical computers. Quantum computing is one such solution for solving problems that classical computers may not be suited for.

Quantum computing employs quantum bits, or "qubits", which can be in a superposition of states "0" and "1" simultaneously, as opposed to a classical computer whose bits can only be in one of two states. This difference allows for quantum computers to complete specific calculations more efficiently, allowing for more complex data to be analyzed faster compared to classical computers.

To take advantage of the benefits of quantum computing, quantum algorithms need to be developed. The quantum algorithms are built to solve specific problems, usually those relating to simulating the natural world. Developing the quantum algorithms takes time, resources, research, and development personnel.

A step in developing quantum algorithms is running them using a quantum computing model, such as a quantum circuit. In a quantum circuit, a step-by-step process is computed with quantum gates operating to change the state of qubits. The ultimate goal of a quantum circuit is to return a measurement of at least one qubit, which holds information needed to solve the problem.

Simulating quantum circuits on classical computers can aid in developing the quantum algorithms needed. The simulations give a better understanding of how quantum computers work, as well as how the quantum algorithms are best optimized and developed. The simulations however take time and resources that can stifle progress of research. Thus, there is a desire for reducing processing time of the quantum algorithm research and quantum circuit simulation.

SUMMARY

At least one embodiment relates to a method for reducing computation time while simulating quantum computation on a classical computer by performing an algorithm used to determine the most efficient input contraction, the method comprising receiving, by a processor, a tensor network representing a quantum circuit; computing, by the processor, an ordering for the tensor network by an ordering algorithm; contracting, by the processor, the tensor network by eliminating indices according to the ordering resulting in a contracted tensor network; and returning, by the processor, the contracted tensor network.

Another embodiment relates to a system for reducing computation time while simulating quantum computation on a classical computer by performing an algorithm used to determine the most efficient input contraction, the system comprising a computer comprising a processor and a memory, wherein the processor is set up to perform operations, embodied in instructions on computer readable medium, to compute an ordering for a tensor network representing a quantum circuit; contract the tensor network by eliminating indices according to the ordering; compute a contracted tensor network; and return the contracted tensor network.

This summary is illustrative only and should not be regarded as limiting.

BRIEF DESCRIPTION OF THE DRAWINGS

The details of one or more embodiments are set forth in the accompanying drawings and the description below. Other features, aspects, and advantages of the disclosure will become apparent from the description, the drawings, and the claims. In the drawings, like reference numerals are used throughout the various views to designate like components.

DETAILED DESCRIPTION OF THE DRAWINGS

Following below are more detailed descriptions of various concepts related to, and implementations of, and methods for simulating quantum circuits. The various concepts introduced above and discussed in greater detail below may be implemented in any of a number of ways, as the described concepts are not limited to any particular manner of implementation. Examples of specific implementations and applications are provided primarily for illustrative purposes.

With large data-sets and computationally-intensive technologies becoming more prevalent, there is a need to decrease computation time and increase computation power to best handle these technologies. Quantum computing can be used in some applications to address this need.

Current widely-available computing systems, also known as classical computers, function using binary code, where data can only be stored in traditional bits as either a "0" or a "1." This proves to be a limitation in how quickly data can be processed by classical computers. These limitations result in increased computational resources, such as time and energy. As such, classical computers are not well-suited for certain applications, such as performing processing of complex equations or modeling of complex functions.

Instead of traditional bits, quantum computers use quantum bits, also known as "qubits," hold information in a state of superposition. Using qubits and superposition allows quantum computers to process more information than classical computers. Because of this, quantum computers have advantages over classical computers in completing calculations or when used to analyze large or complex data sets.

Since qubits can be used to process more information, quantum computer, there are advantages to using quantum computing to complete calculations or facilitate analysis of complex data over classical computers.

To take advantage of the benefits of quantum computing, quantum algorithms need to be developed. The quantum algorithms may be built to solve specific problems, such as problems relating to simulating the natural world. Developing such quantum algorithms takes time, resources, research, and development personnel.

Since quantum computing is still a relatively new field, it is possible to attain relatively significant improvements in computational ability and processing speed. The implementations described herein are related to a quantum circuit simulator. The quantum circuit simulator represents a quantum circuit as a tensor network and facilitates contraction of the tensor network. As a result, larger quantum circuits can be simulated more efficiently, greatly aiding development of quantum algorithms.

Figure 1:
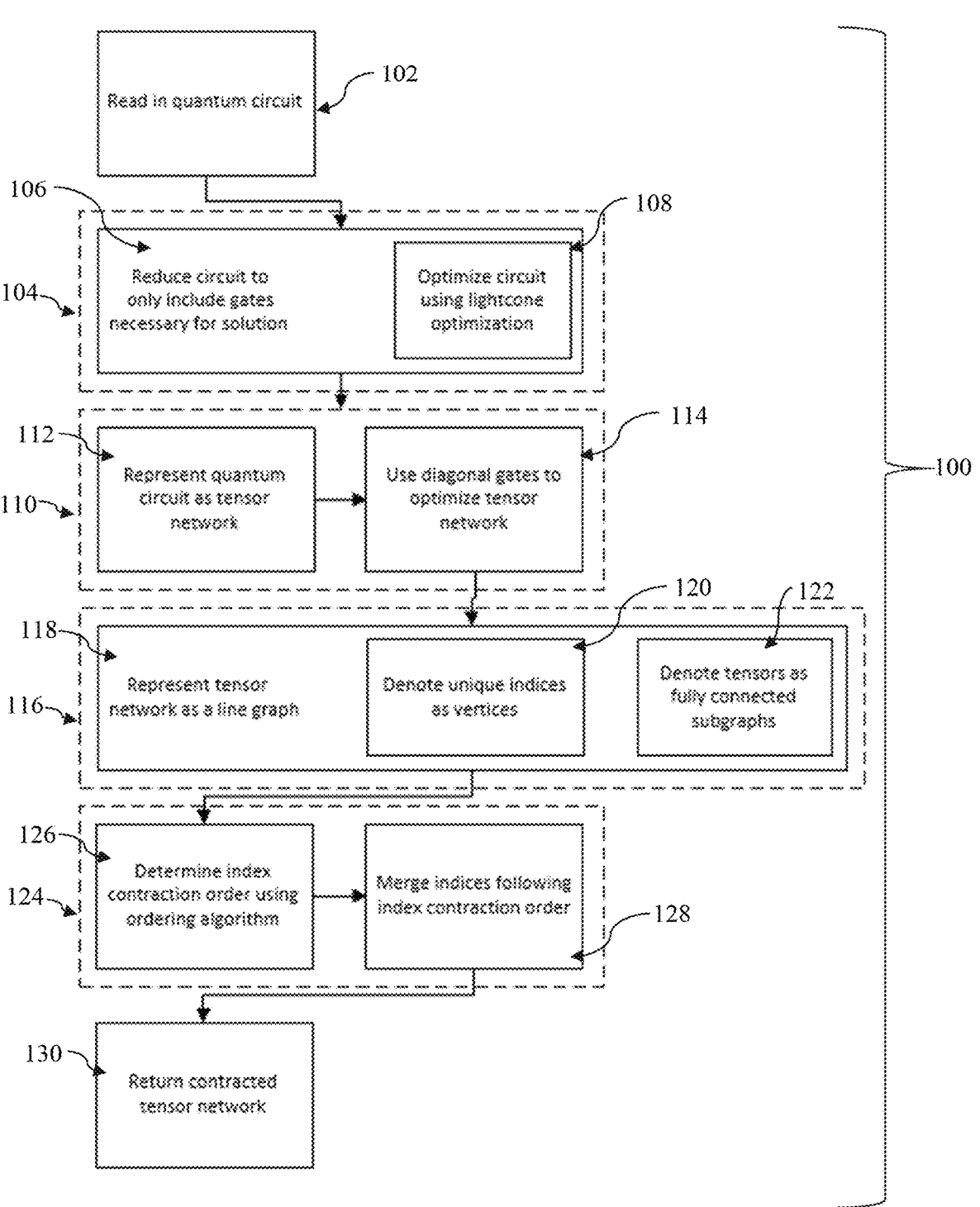
FIG. 1 illustrates a block diagram of a system for quantum circuit optimization, according to an example embodiment.

FIG. 1 depicts a block diagram of a contraction system 100 for quantum circuit contraction. The contraction system 100 is configured to run on a classical computer. The contraction system 100 results in more efficient quantum circuit simulations than simulations without a tensor representation of a quantum circuit. For large calculations at one or more steps, the system may utilize parallelization over multiple processors.

The contraction system 100 includes a reading system 102. The reading system 102 facilitates reading in a quantum circuit. The reading system 102 reads in a quantum circuit inputted by the user. A quantum circuit is a set of gates that operate on qubits, functioning in a quantum computing system similar to a traditional circuit comprising logic gates in a classical computer.

In some embodiments, the reading system 102 reads in a Quantum Approximate Optimization Algorithm (QAOA) circuit. QAOA can be used to solve a wide range of combinatorial problems with many real-life applications. The goal of combinatorial optimization algorithms is to determine a string that maximized a given classical objective function:

$$C(z){:}\{+1,-1\}^N \tag{1}$$

where the solution is represented by an N-bit binary string $z=z_1 \ldots z_N$. QAOA specifically has a goal of finding a string z that achieves a desired ratio r, called "approximation ratio":

$$\frac{C(z)}{C_{max}} \geq r \tag{2}$$

where:

$$C_{max}=\max_z C(z) \tag{3}$$

For example for a MaxCut problem:

$$C_z = \frac{1}{2}(1 - z_i z_j) \tag{4}$$

The contraction system 100 also includes a gate-optimizing system 104. The gate-optimizing system 104 receives the quantum circuit read by the reading system 102. The gate-optimizing system 104 provides initial circuit optimization that reduces memory requirements.

The gate-optimizing system 104 includes a reducing system 106 for reducing a quantum circuit to only include gates necessary for the solution. This process allows for linear scaling of computational power when the qubit count increase, as opposed to exponential scaling on circuits without a reducing system applied, providing a reduced computation cost. In some embodiments, the reducing system 106 includes a subsystem light cone system 108 for optimizing a quantum circuit using light cone optimization. Light cone optimization exploits the structure (i.e., gate sequence) of quantum circuit by comparing two positions of the circuit and determining what gates can be cancelled, such that the end solution is exact and not approximated. In some embodiments, gate reduction methods other than light cone optimization may be used or other gate reduction methods may be used in conjunction with light cone optimization.

The contraction system 100 also includes a tensor system 110 which facilitates tensor network processing after reading in the reduced quantum circuit from gate-optimizing system 104. Tensor system 110 further optimizes the quantum circuit, employing diagonal gates to decrease the complexity of the tensor network.

The tensor system 110 includes a tensor network system 112 for representing a quantum circuit as a tensor network. Quantum computers operate by applying gates of the quantum circuit to a quantum state that describes a system of interacting qubits. When simulating operators of a quantum circuit that act on large systems, it is more useful to represent the state in a tensor form. In tensor notation, operators of a quantum circuit can be represented as a tensor with input and output indices for each qubit it acts upon. The input indices are equated with output indices of the previous operator.

The tensor system 110 also includes a diagonal gate system 114 for optimizing a tensor network using diagonal gates. A property of how tensors are stored and computed provides a unique opportunity for optimization. If a tensor, $U_{ij}$, is diagonal, where i and j are indices of the tensor and $\alpha$ and $\delta$ are variables:

$$U_{ij}=\alpha_i\delta_{ij} \tag{5}$$

then for any indices j in which values of the diagonal tensors indices match, the tensor $U_{ij}$ can be removed from the tensor network and replaced with just $\alpha_i$ without changing the result. This reduces the memory requirements for storage and computational cost for tensor contraction.

In some embodiments, the diagonal gate system 114 uses ZZ gates in addition to diagonal gates. The ZZ gates replacement follows the same thought pattern as diagonal gates, but instead are for 4-index tensors, $U_{ijkl}$, where i, j, k, and l are indices. This 4-index tensor, representing a 2-qubit gate, can be replaced with a 2-index tensor $U_{ij}$, thus reducing the memory requirements for storage and computation cost for tensor contraction.

The contraction system 100 also includes a line graph system 116 facilitates line graph processing after reading in an optimized tensor network from tensor system 110. The line graph system 116 prepares the quantum circuit for final contraction.

The line graph system 116 includes a line graph representation system 118 for representing tensor networks as a line graph. Evaluating a tensor network depends heavily on the order in which indices are summed over. Using a line graph representation of a tensor network allows for finding the most efficient contraction order. Within line graph system 116, line graph representation system 118 includes two subsystems, an index denoting system 120 and a tensor denoting system 122. The index denoting system 120 denotes unique indices of a tensor network as vertices. Every vertex corresponds to a tensor index of a quantum gate. The tensor denoting system 122 denote tensors as fully connected subgraphs. In a line graph, the vertices stand for tensor indices, thus connecting the graph and corresponding to the original quantum circuit.

The contraction system 100 also includes an index contraction system 124 that facilitates contracting a line graph after reading in a line graph from line graph system 116. The index contraction system 124 contracts the tensor network, resulting in a contracted tensor network.

The index contraction system 124 includes an ordering system 126 for determining index contraction order using an ordering algorithm. Generally speaking, ordering algorithms are a vital component in efficient contraction and result in exponential speedup of contraction. Ordering algorithms produce a contraction order that is then used to contract the line graph. The index contraction system 124 may utilize ordering and contraction, including multiple iterations of such. For example, a contraction ordering can be found, some of the indices (some or all) can be contracted, which may be parallelized, then another contraction ordering may be identified, including by a different algorithm, followed by another contraction of some or all indices according to the associated ordering.

In some embodiments, the ordering system 126 uses a greedy algorithm for the ordering algorithm. A greedy algorithm makes the preferred choice at whatever stage it is at without regarding how the choice will affect later stages in the system. This ordering algorithm provides a reasonable result given a short computational budget. Used in the ordering system 126, the greedy algorithm chooses to contract the lowest degree vertex, where degree is the number of vertices adjacent to an index.

In some embodiments, the ordering system 126 uses a randomized greedy algorithm for the ordering algorithm. Randomized greedy algorithms function similarly to greedy algorithms, but instead of choosing the lowest degree vertex, randomized greedy algorithms assign each vertex a probability using Boltzmann's distribution:

$$p(v) = \exp\left(-\frac{1}{\tau}N_G(v)\right) \qquad 6)$$

where the $v$ is the vertex, $N_G(v)$ is number of neighbors, and $\tau$ is a parameter of the randomized greedy algorithm. The randomized greedy algorithm is then repeated q times, and an optimal ordering is selected from the results. The parameter q may be provided by the user, such that when a user wants a faster ordering, a small q is used. If a tensor network is large and/or more complex, a larger q may be provided.

In some embodiments, the ordering system 126 uses a heuristic solver for the ordering algorithm. These solvers use information concerning the entire circuit to solve the ordering problem. Tamaki's heuristic solver was found to provide contraction order improvements with the added benefit of being able to provide a solution after it is stopped at any time. The improvements are noticeable when running from tens of seconds to minutes. The QuickBB heuristic solver was tested, but was found to not provide improvements over other preferred methods such as greedy algorithms.

In some embodiments, the ordering system 126 uses a combination of at least one ordering algorithms such as a greedy algorithm, randomized greedy algorithms, or heuristic solver. Using a single ordering algorithm can result in diminishing returns from additional runtime, while a combination of ordering algorithms allows for balancing ordering improvements and run time of the algorithm.

In some embodiments, ordering in the ordering system 126 is used with the tree decomposition of the line graph. Tree decomposition is a method for representing a line graph as a tree, where the tree simplifies the path between vertices of the line graph. The tree decomposition includes nodes, which store vertices of the represented line graph. Each vertex of the line graph that shares an edge goes into one node. A path connects all the nodes with shared vertices. When used in conjunction with the ordering algorithm, finding a contraction order that minimizes the contraction width is directly related to finding the tree decomposition. Solving the tree decomposition of a line graph is equivalent to finding the perfect contraction order. In some embodiments, other methods for ordering may be used. For example, hyper-graph partitioning algorithms may be used to obtain a tree decomposition of a line graph and contraction order.

The index contraction system 124 also includes a merging system 128 for merging indices following the index contraction order. In embodiments where a merging system 128 is used, the contraction order is a list of tuples of indices, where each tuple represents the group of indices to be merged. A line graph approach for contraction of a general tensor network is:

$$R_{i_1,\ldots,i_p} \sum_{j_1,\ldots,j_q} \prod_{e_i \in F} W_{e_i}^i \qquad 7)$$

where tensor indices $i \ldots, j \ldots$ represent vertices of a graph, $e \in F$ represents edges of the graph, and $W_{e_i}{}'$ represents the tensors that make up the graph. Instead of calculating every element of this summation, merging indices produces an intermediary index after each merge operation. This is completed by selecting vertices $j_i$ from the contraction order and summing over $j_i$ a product of only tensors that have $j_i$ in their index, with the result being an intermediary tensor. The order in which $j_i$ are selected determines how large intermediary indices can get, where bigger indices require more contraction speed and memory. Thus, it is important for the ordering algorithm to determine the most efficient contraction order.

In some embodiments, the merging system 128 may be any method (e.g., merged indices, sequential, etc.) that will eliminate indices from the index contraction order. Multiple methods may be used in combination. These contractions remove the corresponding vertices from the line graph.

In some embodiments, the index contraction system 124 may be repeated. For example, the computer may find a contraction order, then contract a number (i.e., not necessarily all) of indices, then the computer can find a new contraction order, using same or different ordering algorithm, and then again contract a number of indices. This process may be repeated until the desired contraction is achieved, as determined by a user or by the computer.

The contraction system 100 also includes a returning system 130 facilitates returning a contracted tensor network from index contraction system 124. The contracted tensor network of the index contraction system 124 is then returned to the user so that it may be analyzed. In some embodiments, the result of a contracted tensor network is a value or a tensor of values. For example, the result may be an expectation value of an observable or probability amplitude or the result may be a batch of amplitudes where the result is a tensor that contains the amplitudes. Getting results from contraction system 100 requires less memory and shorter computation times.

In some embodiments, such as when the calculations are large, the contraction system 100 may run parallel on multiple processors. During such a parallel process, the tensor network of tensor system 110 would be subdivided into parts by slicing indices of the tensor network, then the subdivisions would be distributed, by a central processor, to a set of computational devices which then execute the calculations. The results from the computational devices are then gathered and the central processor performs the final calculations based on the results from each computational device. Since the computational devices can perform calculations simultaneously, this process allows for a reduction in computation time. In some embodiments, the parallelization process may be run during a repeating process, such as mentioned earlier.

Figure 2:
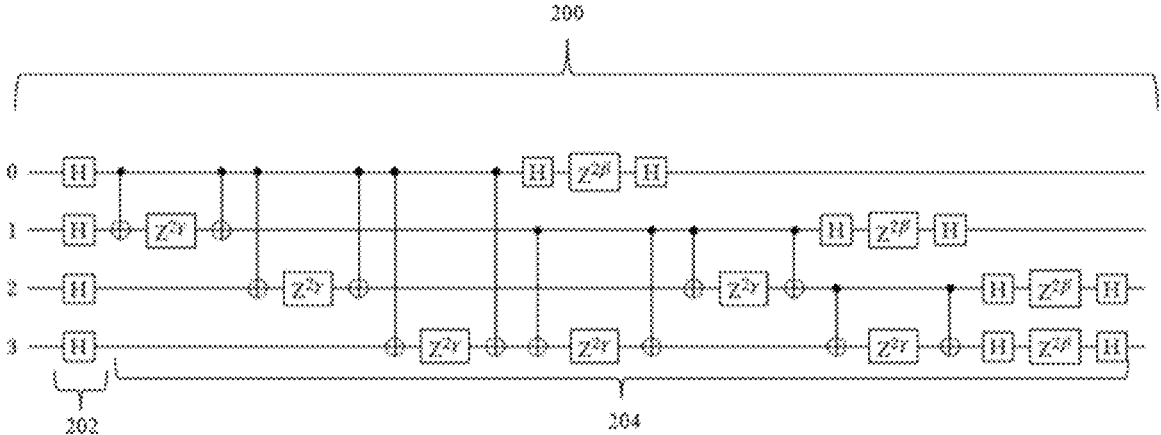
FIG. 2 illustrates an example of a Quantum Approximate Optimization Algorithm circuit for a fully connected graph with 4 nodes, according to an example embodiment.

FIG. 2 depicts a quantum circuit 200 which is an example of a quantum circuit that can be processed by contraction system 100. The quantum circuit 200 includes inputs 202 and operators 204. The quantum circuit 200 was used in testing the invention. The quantum circuit 200 depicts a QAOA circuit. The quantum circuit 200 is applied to solve the MaxCut problem. The MaxCut problem refers to finding the maximum cut of a graph, where a cut of a graph is defined by separating the graph into two disjoint subsets. The cut of the graph is then defined by the number of edges connecting the two subsets. The maximum cut of the graph is thus the cut(s) of the graph such that the number of edges connecting the two subsets is maximized.

The quantum circuit 200 was developed by reformulating the classical objective function (Eq. 1) to be relevant for quantum problems by replacing binary variables z with quantum spin variables $\sigma^z$ resulting in a Hamiltonian $H_C$:

$$H_C = C(\sigma_1^z, \sigma_2^z, \dots), \sigma_N^z \qquad 8)$$

The Hamiltonian $H_C$ is then used with a mixing Hamiltonian $H_B$:

$$H_B = \sum_{j=1}^{N} \sigma_x^j \qquad 9)$$

to evolve the initial state p times. This results is then parametrized by 2p variational parameters $\beta$ and $\gamma$ to obtain the ansatz state of the QAOA:

$$|\psi_p(\beta, \gamma)\rangle = \sum_{k=1}^{p} e^{-i\beta_p H_B} e^{-i\gamma_p H_C} |\psi_0\rangle \qquad 10)$$

Figure 3:
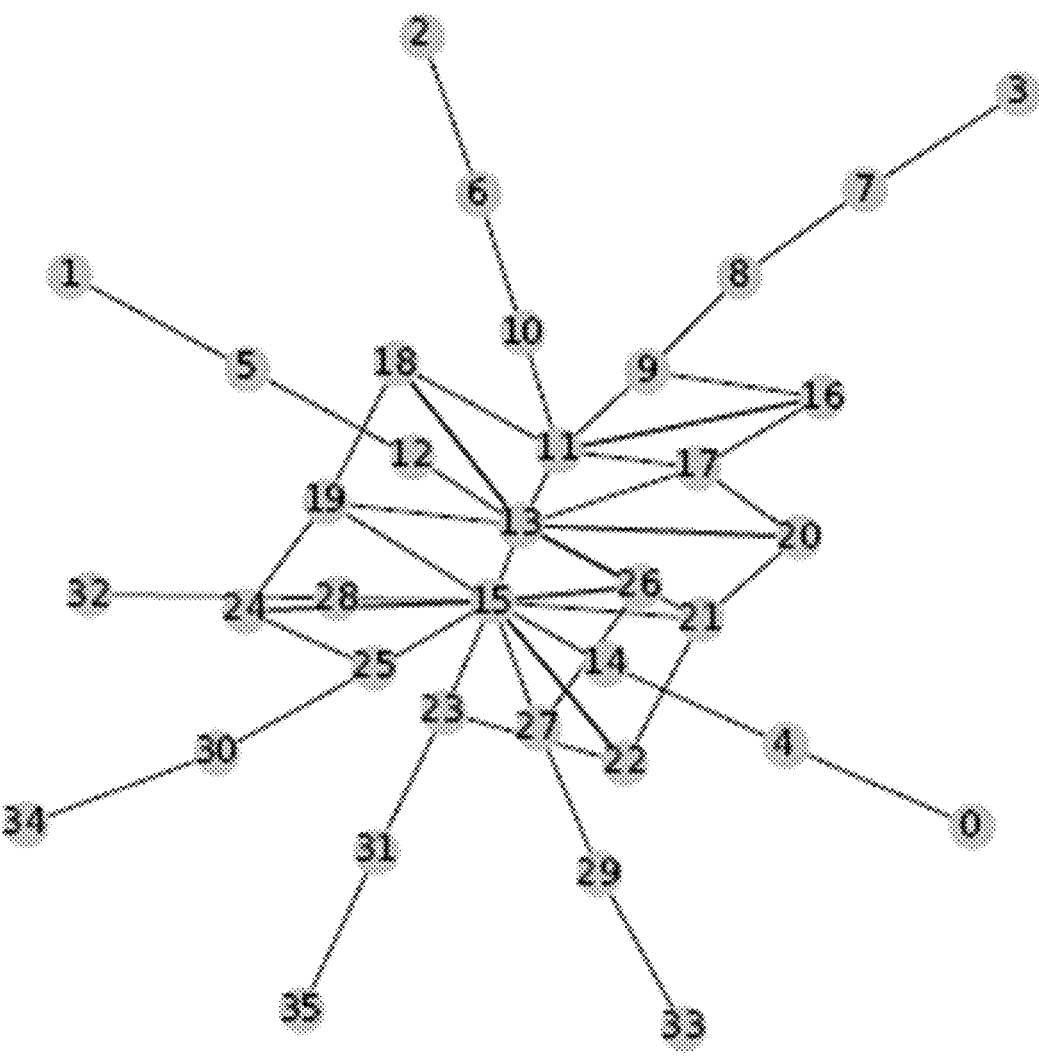
FIG. 3 illustrates the diagram of FIG. 2 represented graphically as a tensor network.

FIG. 3 depicts the quantum circuit 200 represented as a line graph. After first representing the quantum circuit as a tensor network as described above, the tensor network can be expressed graphically. Every vertex, numbered 0-34 corresponds to a tensor index of a quantum gate. Indices labeled 0-3 are indices of the output state vector, and indices 32-35 are indices of the input state vector. After the contraction, vertices corresponding to merged indices are removed from the graph. This decreases the number of neighbors of the vertices, thus decreasing the computational and memory requirements.

Figure 4:
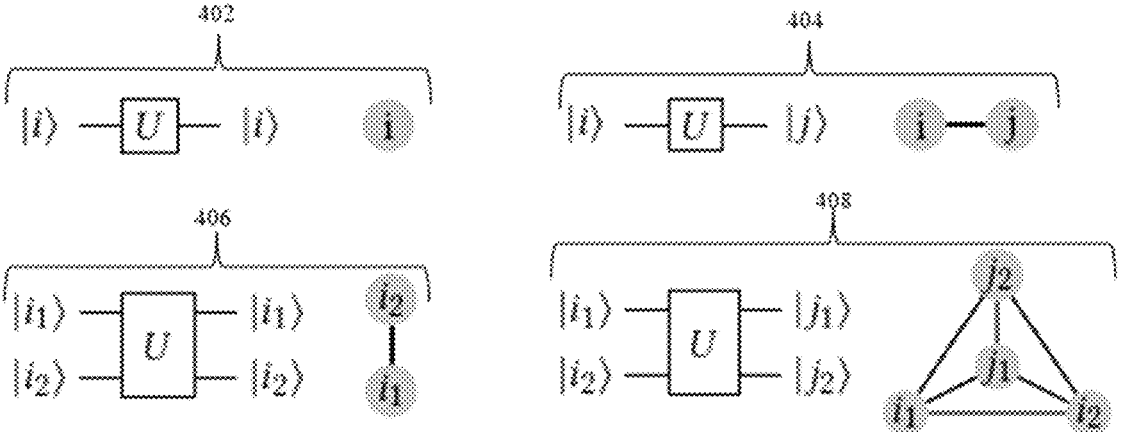
FIG. 4 illustrates tensor network representations of quantum gates of FIG. 2.

FIG. 4 depicts how different gates of a quantum circuit can be represented in a line graph. FIG. 4 includes the a representation of a single quantum gate 402, a representation of a quantum gate connecting two qubit states 404, a representation of a quantum gate connecting two indices of the same qubit state 406, and a representation of a quantum gate connecting two indices of two state vectors 408.

Figure 5:
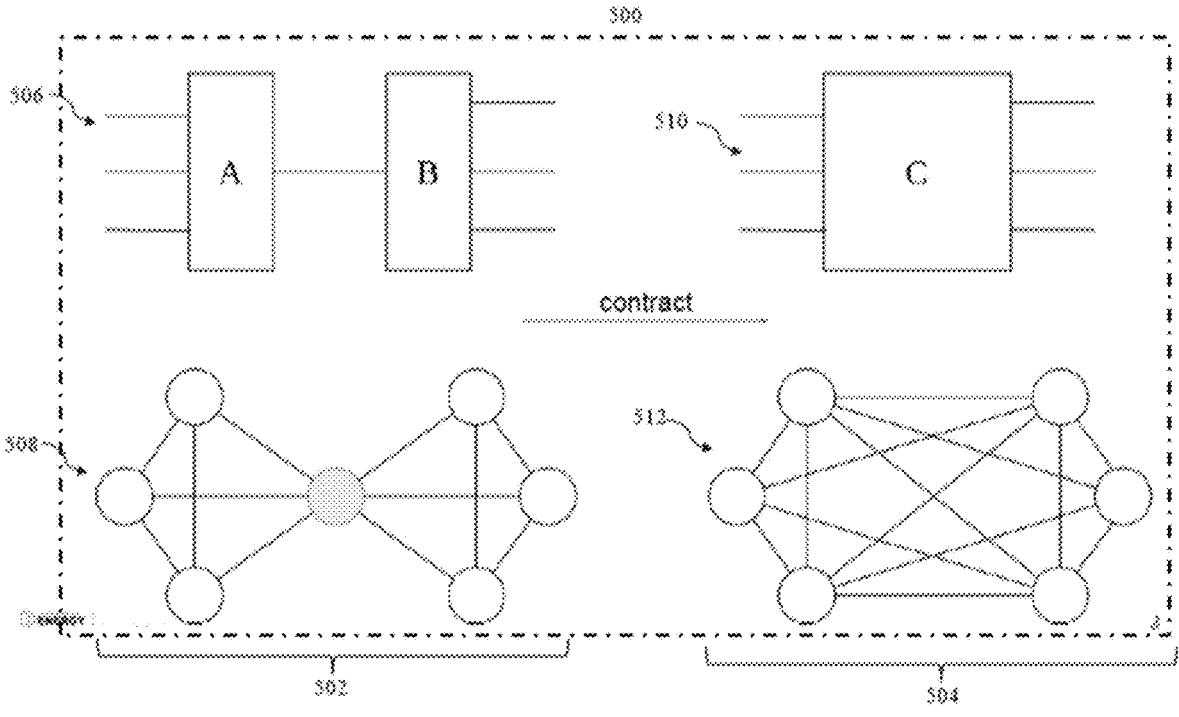
FIG. 5 illustrates quantum gate contractions, according to an example embodiment.

FIG. 5 depicts a contraction 500 of a tensor expression of a quantum circuit. The contraction 500 includes a pre-contracted equivalence 502, and a contracted equivalence 504. The pre-contracted equivalence 502 includes a tensor network 506 and a line graph representation 508. The tensor network 506 and line graph representation 508 represent the same tensor network, but in different forms. The contracted equivalence 504 includes a tensor network 510 and a line graph representation 512. The tensor network 510 and line graph representation 512 represent the same tensor network, but in different forms.

Figure 6:
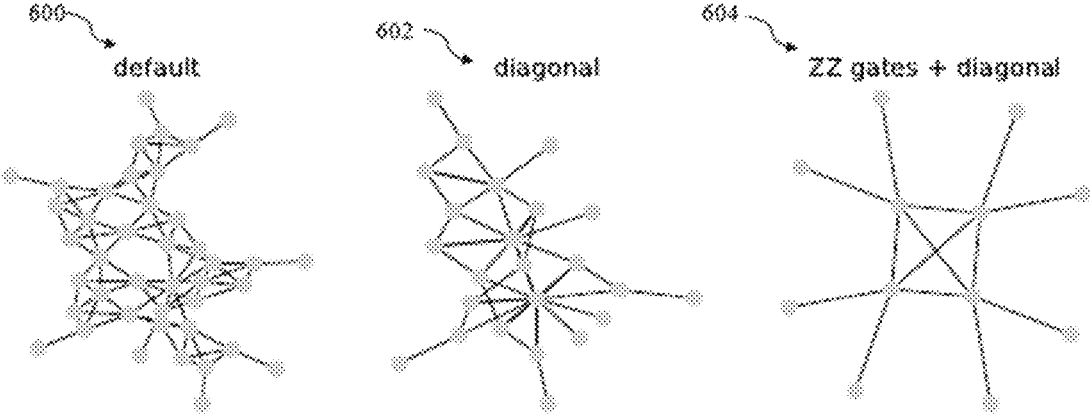
FIG. 6 illustrates diagonal and ZZ gate+diagonal optimization of a quantum circuit; according to an example embodiment.

FIG. 6 depicts a default line graph 600 obtained using a default way of constructing tensor networks, a diagonal gate simplification 602 of the default line graph 600, and a ZZ gate+diagonal gate simplification 604 of the default line graph 600. As described in tensor system 110, simplifications such as diagonal gate simplification 602 and ZZ gate+diagonal gate simplification 604 can be used to reduce the size of a line graph representation of a quantum circuit, thus reducing the memory and computational resources required.

Figure 7:
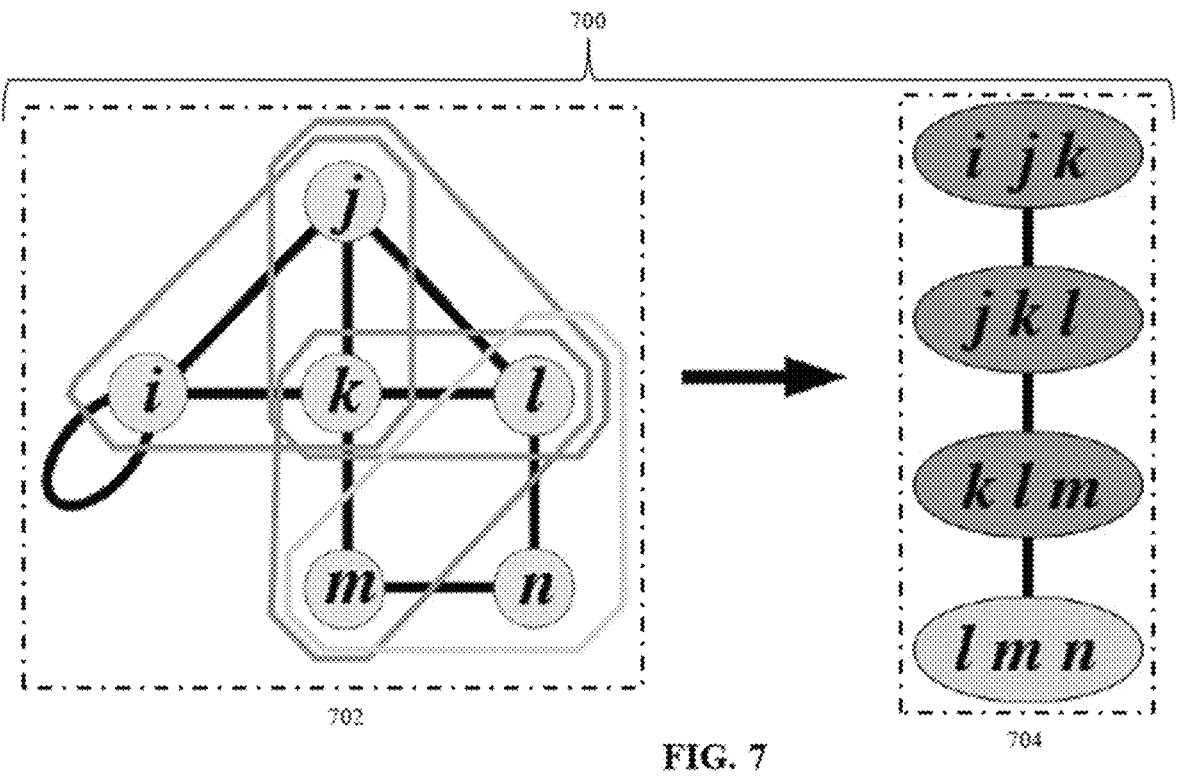
FIG. 7 illustrates tree decomposition of a line graph, according to an example embodiment.

FIG. 7 depicts a tree decomposition 700 of a line graph 702 into a tree 704. The line graph 702 is a line graph representation of a tensor network representation of a quantum circuit. As described in ordering system 126, tree decomposition results in a path between nodes of vertices that can more efficiently be traversed for contraction. Indices sharing an edge in line graph 702 all get put into one corresponding node in tree 704.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

Various embodiments are described in the general context of method steps, which can be implemented in one embodiment by a program product including computer-executable instructions, such as program code, executed by computer in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding act for implementing the function described in such steps.

Software and web implementations of the present disclosure could be accomplished with standard programming techniques with rule based logic and other logic to accomplish the correlation steps, comparison steps and decision steps.

All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in specification should be construed as indicating any non-claimed element as essential. In some cases, the actions recited in the claims can be performed in a different order and still achieve desirable results. In certain implementations, multitasking and parallel processing may be advantageous.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

What is claimed is:

1. A method for reducing computation time while simulating quantum computation on a classical computer by performing an algorithm used to determine a most efficient input contraction, the method comprising:

receiving, by a processor, a read-in of a quantum approximate optimization algorithm (QAOA) circuit having a first plurality of gates;

reduce, by a gate-optimizing system, gates in the QAOA circuit to a second plurality of gates which is less than the first plurality of gates;

represent the QAOA having the second plurality of gates as a tensor network;

computing, by the processor, an ordering for the tensor network by an ordering algorithm;

contracting, by the processor, the tensor network by eliminating indices according to the ordering resulting in a contracted tensor network; and returning, by the processor, the contracted tensor network.

2. The method of claim 1, wherein iterating, by the processer, only removes indices with highest number of connected nodes from the tensor network.

3. The method of claim 1, wherein a contraction index order that provides the lowest contraction width is stored in a contraction schedule in a nontransitory computer readable medium for reuse in simulating different circuit parameters.

4. The method of claim 1, wherein ZZ gates and diagonal gates are used to simplify the tensor network.

5. The method of claim 1, wherein the contraction order is found using tree decomposition.

6. The method of claim 1, wherein light cone optimization is employed prior to contracting the tensor network, such that only gates of the quantum circuit that affect solution are used.

7. The method of claim 1, wherein the ordering algorithm is a greedy algorithm, a randomized greedy algorithm, or a heuristic solver.

8. The method of claim 1, wherein a contraction of the tensor network is a merged index contraction.

9. A system for reducing computation time while simulating quantum computation on a classical computer by performing an algorithm used to determine the most efficient input contraction, the system comprising:

a computer comprising a processor and a memory, wherein the processor is set up to perform operations, embodied in instructions on computer readable medium, to:

receive a read-in of a quantum approximate optimization algorithm (QAOA) circuit having a first plurality of gates;

reduce, by a gate-optimizing system, gates in the QAOA circuit to a second plurality of gates which is less than the first plurality of gates;

represent the QAOA having the second plurality of gates as a tensor network;

optimize tensor network through implementation of diagonal gates;

compute an index contraction ordering for the tensor network;

merge a portion of indices of the tensor network to contract the tensor network according to the index contraction ordering;

compute a contracted tensor network; and return the contracted tensor network.

10. The system of claim 9, wherein the processor only removes indices with highest number of connected vertices from the tensor network.

11. The system of claim 9, wherein the lowest contraction width is stored in a contraction schedule in a nontransitory computer readable medium for reuse in simulating different circuit parameters.

12. The system of claim 9, wherein the ordering is determined by a greedy ordering algorithm, a randomized greedy ordering algorithm, or a heuristic solver.

13. The system of claim 9, further comprising optimizing the tensor network prior to computing an ordering by use of ZZ gates.

14. The system of claim 9, wherein the contraction order is found using tree decomposition.

15. The system of claim 9, wherein the gate optimization system utilizes light cone optimization is employed such that only a gates of the quantum circuit that affect solution are used.

* * * * *